United States Patent [19]

Couper et al.

[11] Patent Number: 4,995,837
[45] Date of Patent: Feb. 26, 1991

[54] PRECISION TEST CONNECTOR

[75] Inventors: William D. Couper; George W. Michael, both of Harrisburg, Pa.

[73] Assignee: AMP Incorporated, Harrisburg, Pa.

[21] Appl. No.: 520,492

[22] Filed: May 8, 1990

Related U.S. Application Data

[63] Continuation-in-part of Ser. No. 400,619, Aug. 30, 1989, Pat. No. 4,936,800.

[51] Int. Cl.$^5$ ............................................. H01R 13/00
[52] U.S. Cl. ..................................................... 439/863
[58] Field of Search ......................................... 439/863

[56] References Cited

U.S. PATENT DOCUMENTS

| | | | |
|---|---|---|---|
| 3,627,929 | 12/1971 | Ulijmen et al. | 179/96 |
| 4,441,781 | 4/1984 | Forney, Jr. et al. | 339/177 R |
| 4,580,862 | 4/1986 | Johnson | 339/64 R |
| 4,697,859 | 10/1987 | Fisher, Jr. | 439/246 |

Primary Examiner—Joseph H. McGlynn

[57] ABSTRACT

A testing device such as a network analyzer is joined to a test unit, such as a circulator, by an electrical precision test connector 1 having an electrical conductor 2 with conductive end portions 34 and 40, a hollow, bipartite shell 3 and a dielectric insert 4 as part of the conductor 2, the electrical conductor 2 further comprising a flexible, slotted contact end portion 24 with flat, opposing contact surfaces 36 and 37 with the slotted end portion being pinched 38 for a slideable, clamping engagement, above and below, with an inserted tab connector and the hollow, bipartite shell 3 having an end contact surface 24 and being spring biased to provide complete electrical contact with a corresponding portion of the test unit 54 during connection. The test connector 1 is characterized by a rear contact surface 24 having substantially a square profile with four flats 59, each disposed at ninety degrees around the annular face to permit the electrical conductor 2 to be withdrawn from a fixed plate 56 having interior flat surfaces 59A and the electrical conductor 2 rotated ninety degrees and replaced within the fixed plate 56 with flats 59 of its annular face fitted to the complementary flats 59A of the fixed plate 56 to prevent rotation of the conductor 2 and, consequently, misalignment within the said fixed plate 56. Further, the test connector 1 is characterized by an electrical conductor 2 with enlarged annular waist 4 which fits within the shell 3 to prevent rotational movement relative thereto.

9 Claims, 4 Drawing Sheets

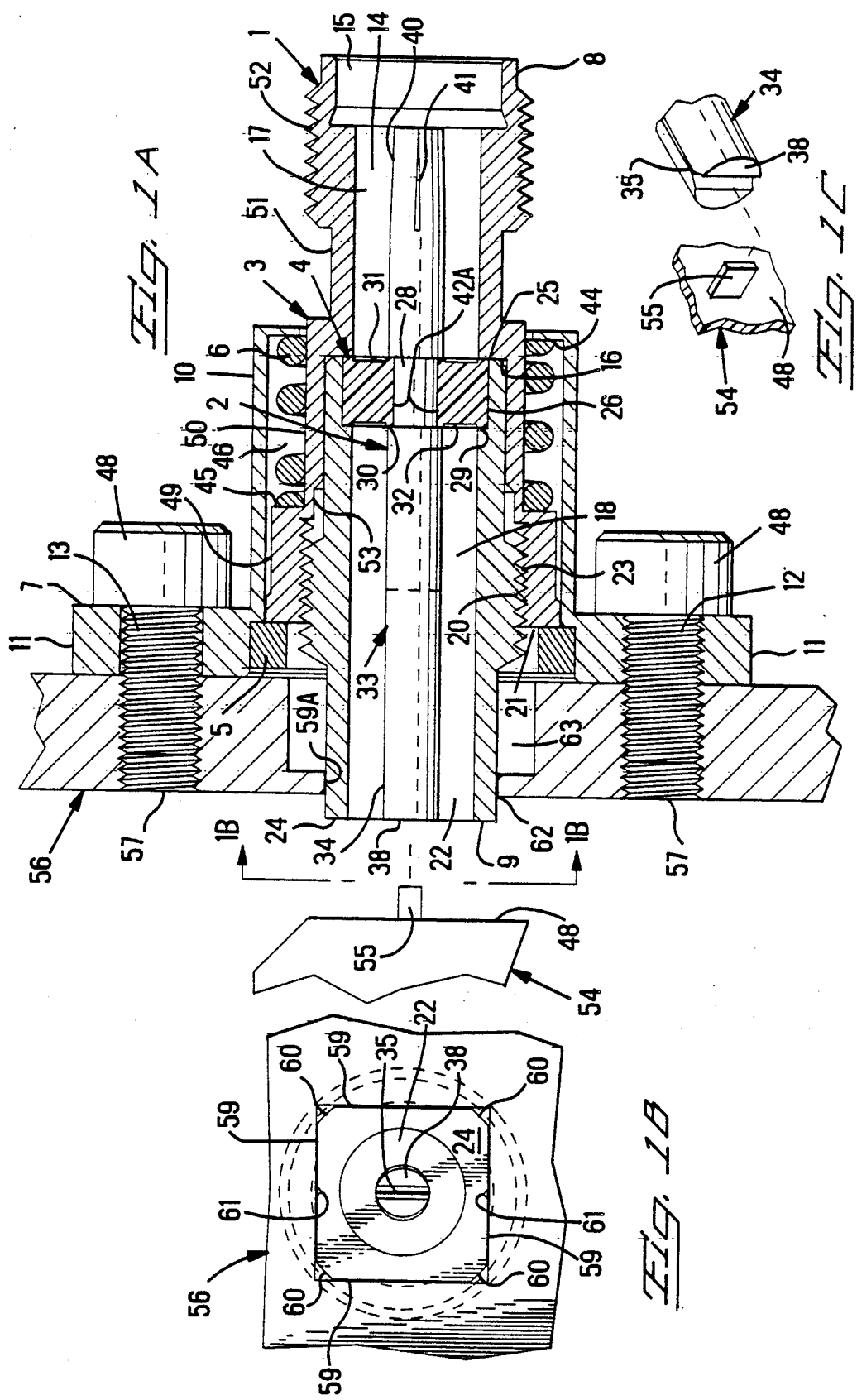

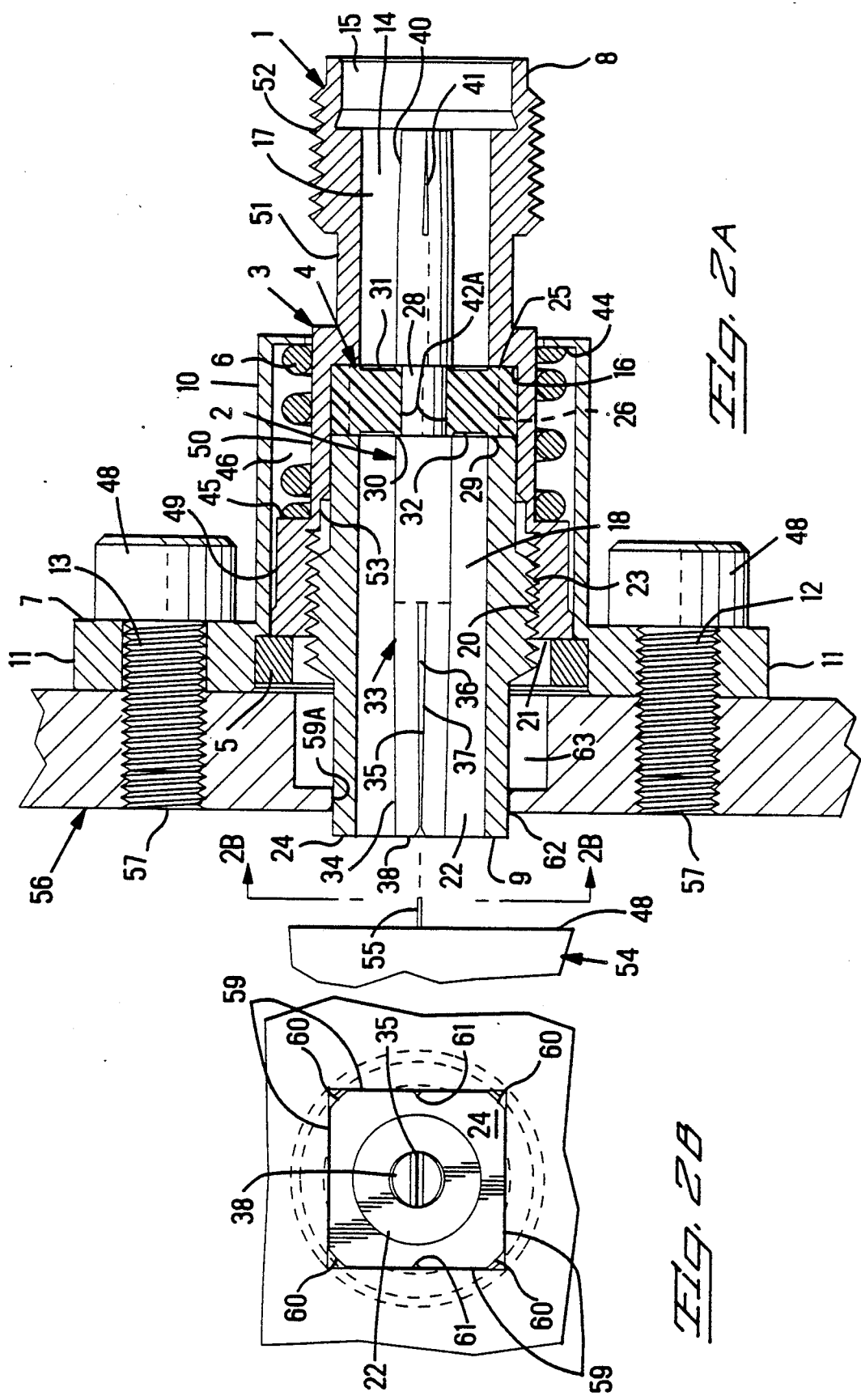

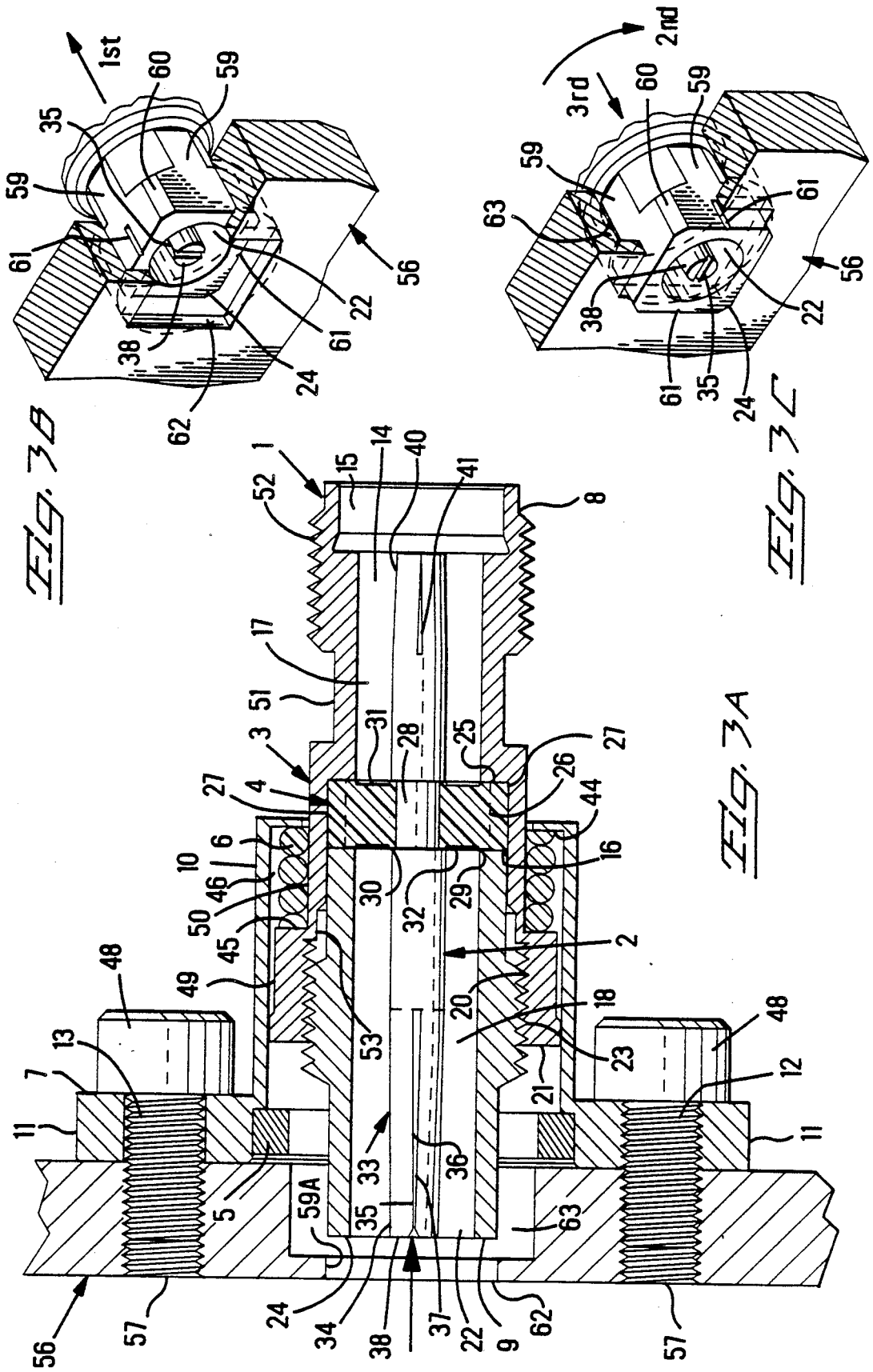

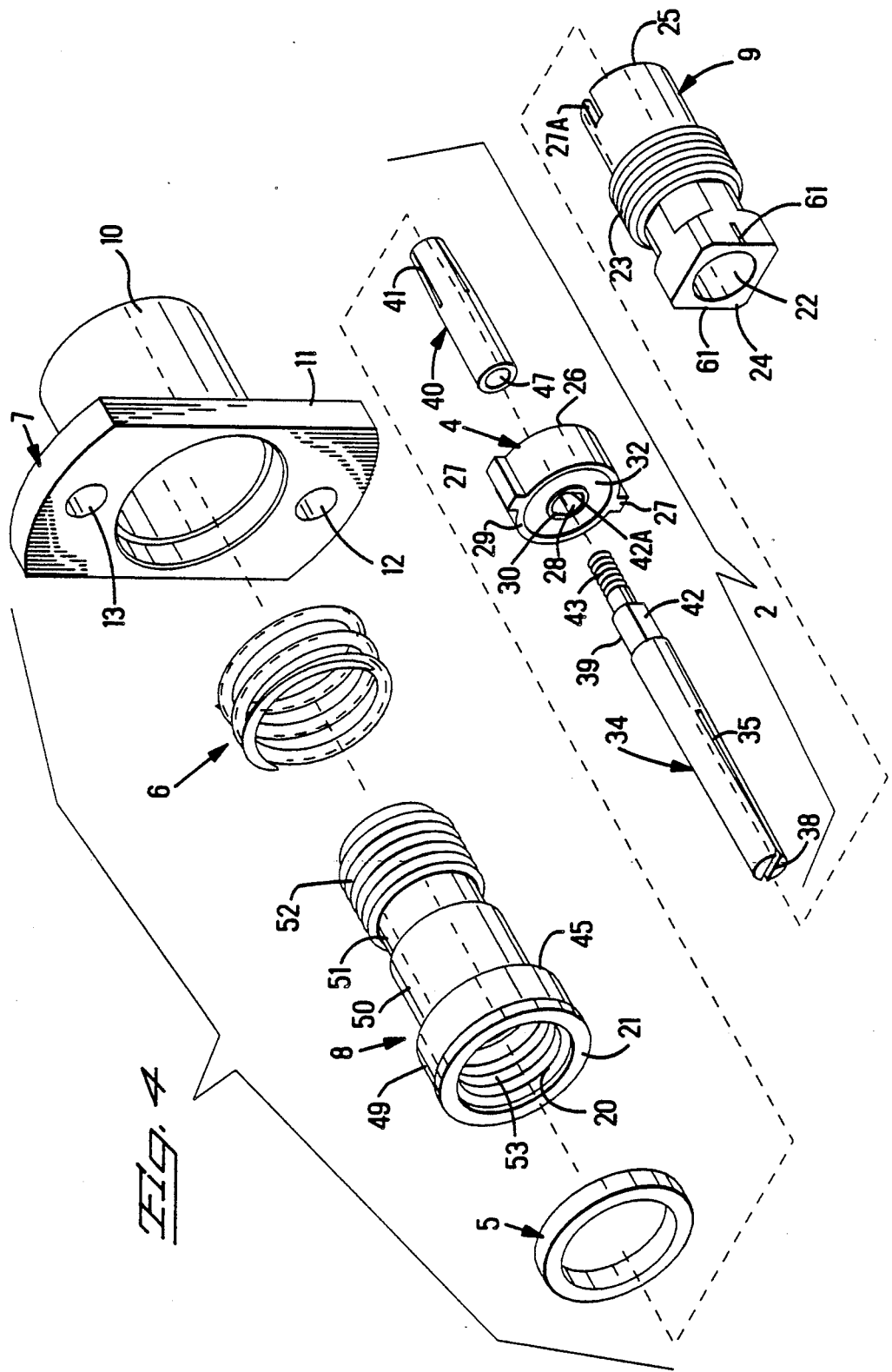

PRECISION TEST CONNECTOR

FIELD OF THE INVENTION

This application is a continuation-in-part of copending application Ser. No. 400,619 filed Aug. 30, 1989, now U.S. Pat. No. 4,936,800. This invention relates to an electrical precision test connector assembly for disconnect connection to the tab lead of a ferrite component such as a circulator or isolator.

BACKGROUND OF THE INVENTION

An electrical precision test connector assembly comprising an electrical conductor with conductive end portions and a hollow shell encircling the electrical conductor is utilized to connect a testing device with a subject ferrite component which is to be tested for electrical continuity, short circuiting or to determine reflection coefficient and the like. More particularly, the precision test connector is utilized in the testing of a ferrite component such as a circulator or isolator operating at microwave frequencies and having thin and narrow tab leads. Exacting standards of performance are set for these components.

Circulators and isolators provide nonreciprocal transmission paths, i.e. microwave energy may travel the transmission path in one direction with little loss but will be greatly absorbed when applied from the opposite direction. The nonreciprocal action provides useful benefits, and circulators are commonly used as duplexers in connection with a transmitter, antenna and receiver, as coupling elements in reflection amplifiers, such as parametic amplifiers and tunnel-diode amplifiers, or in conjunction with bandpass filters. Isolators are used between transmitter and antenna in communications and radar systems to eliminate energy reflected from the load back to the source. Resonance isolators are used as interstage isolators to minimize reflections between circuit elements.

The present invention is applicable to so-called "drop-in" components, particularly circulators and isolators, which are microminiature ferrite devices having input/output tab leads whereby the component with a tab lead is "dropped" onto a printed circuit board and the lead is soldered to form a connection thereto. The tab leads are extensions of the circulator/isolator center conductor itself. The leads may be made of gold-plated beryllium copper. The tab leads are preformed at manufacture to provide optimum contact with the circuit and a tension-free solder joint.

In the testing of circulators and isolators with tab leads, the ferrite component is connected by solder to a single trace micro-strip transmission test fixture and thereto a testing unit such as an automatic vector network analyzer, for the purpose of testing for return and insertion loss to determine reflection coefficient. Connecting testing unit and ferrite component is a time consuming process. Further, the tab lead itself may be damaged by soldering to the test fixture. Indeed, manufacturers recommend that customers test the circulator or isolator components only if there is an unusual need for precise measurement of performance prior to actual use.

Other problems associated with the testing of such components include maintaining a complete, firm and reproducible electrical contact between the tab lead of the component and the testing unit. Results obtained during one testing must be reproducible with further testing, and this depends, to a great degree, on consistent, nonvarying electrical contact between tab lead and testing unit. Further, test data obtained by performing the test must be nonvarying while the test is being conducted over a time interval. Further, the test data must be consistent with test data obtained from repeated tests performed to assure that the ferrite component will retain its ability to operate according to desired standards. Reproducibility over periods of time, again, is affected by the reliability of the particular electrical precision test connector that connects the ferrite component to the testing unit.

Known test connectors include Vlijimen, et al., U.S. Pat. No. 3,627,929 relating to the distribution frame of a telephone exchange having a break jack assembly for disconnect cross connection and for connection to a test plug unit. The assembly has contact springs with rectilinear portions to provide flat contact surfaces. The flat contact surfaces are urged into contact with a plug member of a test plug unit. Keller, et al., U.S. Pat. No. 4,734,651, describes a device for testing for electrical continuity and short circuits between terminals of a multicontact electrical connector and conductive cores of electrical leads. Forney, Jr. et al., U.S. Pat. No. 4,441,781 relates to a method for terminating coaxial cable and discloses a connector having a front shell, a rear shell, a dielectric insert, a center contact, a coupling and a locking ring. Johnson, U.S. Pat. No. 4,580,862, and Fisher, U.S. Pat. No. 4,697,859, disclose spring biased, float mounted connectors for coaxial cables.

The device of the present invention is an electrical precision test connector assembly for interconnecting a testing unit with a subject component which is to be tested for electrical continuity, reflection coefficient or the like. The present invention is an improvement to the invention described and claimed by Couper, et al., U.S. patent application Ser. No. 400,619. The Couper et al., application points out the problems associated with the testing of ferrite components and emphasizes that maintaining a complete, firm and reproducible electrical contact between the tab lead of the component and the testing unit is important. The present invention relates to an improved electrical precision test connector assembly which improves the reproducibility of the electrical contact between tab lead of the component and the testing unit by providing a device characterized by polarization of an electrical conductor within the connector shell, and further characterized by a connector shell being capable of orientation of an end contact surface at 90 degree intervals. The improvement to the electrical conductor assures a precise polarized alignment of the conductor within the shell, and the improvement to the front face of the shell provides precise polar alignment of the connecting end face of the connector shell to a test unit.

SUMMARY OF THE INVENTION

One object of this invention is to provide a connector which may be interconnected so as to provide consistent, nonvarying contact to assure accurate and reproducible results. Another object of the invention is to provide such a connector that will assure accurate and reproducible results over an extended period of time and after repeated usage. Another object is to provide a device that quickly and easily may be connected and without the need for soldering. Since oftentimes the leads of the components to be tested are fragile and subject to damage, the connector must establish a reliable and complete connection without damaging the leads. Circulators are examples of test units with fragile gold-plated tab leads.

The test connector assembly of the present invention accomplishes these objectives and comprises an electrical conductor with conductive end portions and a hollow shell encircling the center electrical conductor. The electrical conductor comprises a flexible, slotted contact end portion with flat, opposing, electrical contact surfaces. The end portion is closed at one end for slideable, clamping engagement With an inserted tab connector to thereby maintain flat, biased, electical contact, above and below, with a portion of a tab lead. The electrical conductor, further, is recessed at the opposite end portion for connection with a corresponding electrical conducting unit.

The hollow shell has a rear contact surface encircling the slotted contact end portion of the conductor and an outer body with a partial overlap portion and flange portion to define a groove between the bodies. The test connector assembly further comprises spring means positioned against the shell and biasing the shell into complete annular electrical contact of the circular contact surface with the complementary body of the component which is to be tested.

The test connector of the present invention is characterized by a rear contact surface having a profile with flat surfaces for fit to corresponding flat surfaces of the port of a fixed plate to prevent rotational movement of the electrical conductor within the port. The profile of the rear contact surface may be substantially of a shape of a square with four flats. Each of the flats is disposed at 90 degrees around the annular face. This permits the electrical conductor to be withdrawn from the fixed plate, rotated 90 degrees and replaced within the fixed plate with the flats of its annular face engaging the flats of the fixed plate. This prevents rotation of the conductor within the fixed plate.

Further, the electrical precision test connector may further comprise an annular dielectric insert encircling the body of the conductor to form an enlarged annular waist positioned within the hollow shell. The hollow shell may be characterized by slots with the annular dielectric insert further characterized by nubs. The nubs of the dielectric insert are complementary to the slots and are secured therein to prevent relative rotational movement of the electrical conductor.

In a preferred embodiment, the hollow shell comprises a hollow jack body having end contact surface and an outer body with partial overlap portion with outward flange, circumferential to the outer body. The assembly includes a cup-shaped mounting member that has an inward lip encompassing the outer body of the shell to thereby define an annular groove between the body and the mounting member. A spring means is positioned within the groove. The spring means may be a coil spring with one end biased against the outward flange portion of the outer body and one end biased against the inward lip of the mounting member to urge the end contact surface of the jack body into complete, electrical contact with a complementary body of a test unit during connection.

One feature of the present invention is that the electrical center conductor is characterized by a precisely machined slot in a solid end portion of the conductor which forms a continuous mating surface for the flat tab of the device being measured. The correct spring forces on the mating tab are obtained by drilling out the conductor from the opposite end to form two semicircular beam members. When in connection with a tab lead, the slotted contact end portion of the electrical conductor of the present invention forms a biasing, flat clamping engagement above and below the inserted tab lead so as to firmly hold the lead in electrically conductive relationship, without causing damage. It is a particular advantage of the present invention that this type of connection may be reproduced with reliable results for repeated testings over extended periods of time.

These and other advantages, features and objectives of the invention are disclosed by way of example from the following detailed description and accompanying drawings.

BRIEF DESCRIPTION OF THE DRAWINGS

FIG. 1A is a side sectional view of an electrical precision test connector assembly which is a preferred embodiment of the present invention.

FIG 1B is a rear elevation view of the device of FIG. 1A taken along lines 1B—1B of FIG. 1A.

FIG. 1C is a perspective view of portions of the tab lead in slotted contact end portion of the connector.

FIG. 2A is a side sectional view of the electrical precision test connector with rear hollow body rotated 90 degrees from the orientation of the rear hollow body as shown in FIG. 1A and as hereinafter described.

FIG. 2B is a rear elevation view of the device of FIG. 2A taken along lines 2B—2B of FIG. 2A.

FIG. 3A is a side sectional view of the electrical precision test connector of FIG. 2A with bipartite shell extracted from a fixed plate, while FIG. 2A shows the bipartite shell loaded within the square port of the fixed plate as hereinafter described.

FIG. 3B is a perspective view of a portion of the bipartite shell and fixed plate of FIG. 3A showing the bipartite shell being extracted from the port of the plate.

FIG. 3C is a perspective view of the same portion of bipartite shell and fixed plate as shown in FIG. 3B but is an illustration of rotating the shell 90 degrees and reinserting the shell into the port of the plate.

FIG. 4 is a fragmented perspective view of the electrical connector assembly shown in FIG. 1A.

DESCRIPTION OF PREFERRED EMBODIMENT

With reference to FIGS. 1, 2, and 3, each electrical precision test connector assembly 1 includes an electrical conductor 2, a hollow, bipartite, conductive shell 3, annular dielectric insert 4, retaining ring 5 and spring 6. Also shown is mounting member 7, which has a cup-shaped portion 10 encompassing, substantially, front outer body 8 and rear hollow jack body 9 of the bipartite shell 3 and a flange portion 11 with holes 12 and 13 to accommodate fasteners 48, such as bolts, for mounting the test connector assembly 1 to fixed plate 56 having port 58 for accepting a portion of jack body 9 as hereinafter described. The hollow bipartite shell comprises threaded front outer body 8 and rear hollow jack body 9. Front body 8 has stepped bore 14 extending therethrough including recess 15, inwardly flanged 16, to accept a corresponding connection of a conventional coaxial cable connector (not shown), center barrel section 17 and rear section 18 having bore of greater diameter than that of the barrel section 17. Front outer body 8 has three cylindrical portions 49, 50 and 51 of different outer and inner circumference, and outward threaded portion 52 for threadable connection with a testing unit such as an automatic network analyzer. Cylindrical portions 49 and 50 form outer flange 45, and portions 50 and 51 form inner flange 16. Front body 8 has inward threads 20 on its inside rear wall 53. Body 8 terminates in annular face 21.

Hollow bipartite body 3 further includes rear hollow body 9 with uniform core 22 with threading 23 for insertion into front body 8 and connection with corresponding threading 20 of front body 8, end contact surface 24 and forward annular end 25. Toward the front of rear hollow body 9 are polarizing slots 27A located at 180 degrees around the annular profile of body 9. End contact surface 24 is substantially square in profile with removed corners to thereby form an octagonal profile with four edges 59 equal to one another and four other edges 60 equal to each other. Further, the rear of body 9 at the octagonal profile is characterized by opposing flutes 61 which serve as identification marks signifying the particular orientation of bipartite shell as loaded within port 58 of fixed plate 56 as hereinafter described.

The conductor 2 has enlarged annular waist comprising an annular dielectric insert 4 with bore 28, round in shape, but with flatted sides 42 for securing electrical conductor 2 into fixed position. Insert 4 is a one piece body having an outer ring structure 26 with nubs 27 for fit into complementary slots 27A of rear hollow body 9. Insert 4 is characterized by outer bead 29 and inner bead 30 forming annular recess 31 and annular recess 32.

Electrical conductor 2 consists of insert 4 and substantially barrel-shaped bipartite body 33 of portions 34 and 40. Portion 34 is a solid end section characterized by a precisely machined slot 35 for slideable engagement with the inserted input/output tab lead 55 of a ferrite component 54, such as a circulator, which is to be evaluated to determine return loss, insertion loss for reflection coefficient and the like. As shown, the electrical conductor 2 comprises a resilient spring, slotted contact end portion 34 with flat, opposing contact surfaces 36 and 37. End part 34 is biased into a closed position when not engaged with the tab lead of a ferrite component. The nose 38 of slotted portion 34 may be beveled to provide a flared entry for the tab lead 55 of the circulator 54. Portion 34 further includes narrow waist section 39 for fitting within the bore 28 of annular dielectric insert 4 to form annular waist with nubs 27 and outward threads 43 for interconnection with inner threads (not shown) of portion 40 to form bipartite body 33. Waist section 39 is particularly characterized by flats 42 which fit to complementary flatted sides 42A within bore 28 of annular dielectric insert 4 to prevent rotation of the bipartite body 33 relative to the insert 4. The adapter portion 40 of electrical conductor 2 has a clamping type connector 41. Within the bore 47 of adapter portion 40 are inner threads (not shown) for interconnection with the outward threads 43 of portion 34.

Cup-shaped portion 10 of mounting member 7 is inward-lipped to form annular flange 44. Correspondingly, front outer body 8 of the hollow bipartite shell 3 has an outer flange 45 formed by cylindrical portions 49 and 50 which, in conjunction with flange 44 of the mounting member 7, define an annular recess 46 circumferential to the barrel of portion 34 of shell 3. Spring means 6, shown as a coil spring, is positioned within the annular recess 46 with one end biased against the outward flange 45 of front outer body 8 and one end biased against the inward flange 44 of part 9 into complete electrical contact with complementary surface 48 of a testing unit or ferrite component 54 with tabs 55 inserted into slot 35 of conductor 2.

Shown also is fixed plate 56 for providing a mounting for the electrical test connector 1. Fixed plate 56 has mounting holes 57 and port 58. Port 58 is in two sections having a smaller rear portion 62 substantially square shaped in profile and an enlarged forward portion 63.

In constructing the test connector 1, portions 34 and 40 are threaded together with waist section 39 residing within bore 28 of insert 4, flats 42 flush to flats 42A. The conductor 2, including insert 4, is fitted within central barrel section 17 of front body 8 and core 22 of rear body 9 with nubs 27 of insert 4 fitted to complementary slots 27A. The combination of the fit of nubs 27 to slots 27A and flat surfaces 42 of portion 34 to the flats 42A within bore 28 of insert 4 retain the conductor 2 polarized within the bipartite shell 3 preventing relative rotation of the bipartite body 34.

Spring 6 is fitted circumferentially to the combination of the bipartite shell 3 with conductor 2 and these parts are loaded into the cup-shaped portion 10 of mounting member 7 with spring 6 biased within annular recess 46. Retaining ring 5 is fitted to the rear hollow jack body 9 of conductor 2. The precision test connector 1 is then secured to fixed plate 56 by means of fasteners 48 through mounting holes 12 and 13 of flange portion 11 to mounting holes 57 of the plate 56 with end contact surface 24 of jack body 9 disposed therethrough port 58.

In operation, the electrical precision test connector 1 is attached to a testing unit, such as an automatic vector network analyzer, usually by mating with a plug of the analyzer into the recess 41 of the clamping portion 40 of the conductor 2. Thereafter, and one-by-one, the ferrite components, such as circulators, having tab leads 55, are connected to electrical test connector 1 by inserting lead 55 within spring biased, slotted contact end portion 34 to form a slideable, clamping engagement both above and below the lead 55. Spring means 6 urges end contact surface 24 forward and against the body 48 of the circulator so that forward annular end 24 abuts the body 48 of the circulator to provide a conductive electrical contact between the body 48 of the circulator and the hollow shell 9 of the test connector 1. The circulator is tested while contact surfaces 36 and 37 maintain flat, biased electrical contact above and below a portion of the tab lead 55. Upon completion of testing, the lead 55 is withdrawn and the tab lead 55 of another circulator is connected for testing.

Particularly with respect to the present invention, in FIGS. 2A and 2B, the precision test connector 1 is shown loaded within port 58 of fixed plate 56. The flat sides 59 of end contact surface 24 fit to the flat sides 59A of the the port 58 preventing relative movement and providing a fixed profile to enhance the fit of tab 55 of test unit 54 to slot 35 of conductor 2 for improved testing. Then, with reference to FIGS. 3A through 3C, the conductor 2 and shell 3 may be withdrawn from rear portion 62 of port 58 against the bias of spring 6 into the annular bore-shaped forward portion 63 of port 58, (FIGS. 3A and 3B), rotated 90 degrees and reloaded within the square rear portion 62 for testing of a circulator or the like at a 90 degree orientation from that of the first testing.

Although described with particular reference to the testing of ferrite components, the electrical precision test connector of the present invention may be used with any component of the "drop-in" type having tab leads for soldering to a circuit board. Suitable devices include switches, amplifiers, attenuators, mixers, filters, terminations, transformers, frequency multipliers, limiters, directional couplers, power splitters and combiners, phase shifters, duplexers, discriminators, modulators, and oscillators. The present electrical precision test connector permits reliale and accurate testing of such devices without damaging tab leads.

While what has been described constitutes a presently preferred embodiment of the invention, it should be recognized that the precision test connector assembly may take numerous other forms. For example, the electrical conductor 2 may be of various configurations so long as the rear contact surface 24 is characterized by a profile with flat surfaces 59 for fit to the corresponding flat surfaces 59A of the port 58 of the fixed plate 56 to prevent rotational movement of the electrical conductor therein. Accordingly, it should be understood that the invention is to be limited only insofar as required by the scope of the following claims.

We claim:

1. An electrical precision test connector assembly comprising an electrical conductor with conductive end portions and a hollow shell encircling the electrical conductor;
   wherein the electrical conductor comprises slotted contact end part with flat, opposing electrical contact surfaces and said portion being pinched for a slideable, clamping engagement, above and below, with an inserted tab lead to thereby maintain flat, biased electrical contact above and below a portion of the lead; the hollow shell comprises rear contact surface encircling the slotted contact end portion of the conductor and said rear contact surface having a profile with flat surfaces for fit to corresponding flat surfaces of the port of a fixed plate to prevent rotational movement of said electrical conductor within said port; and the test connector assembly further comprises a spring means positioned against the shell and biasing the shell into complete electrical contact of the rear contact surface with a corresponding body of a component which is to be tested;

2. The electrical precision test connector assembly of claim 1 wherein the electrical conductor is recessed at the end portion opposite the slotted end portion, for connection with a corresponding plug-type connector.

3. The electrical precision test connector assembly of claim 1 wherein the profile of said rear contact surface is substantially of the shape of a square with four flats, each disposed at 90 degrees around said annular face to permit the electrical conductor to be withdrawn from said fixed plate having interior flat surfaces and the electrical conductor rotated 90 degrees and replaced within the fixed plate with flats of its outer annular face engaging the flats of the fixed plate to prevent rotation of the conductor within the said fixed plate.

4. The electrical precision test connector of claim 1 wherein said electrical conductor further comprises an annular dielectric insert encircling the body of the conductor to form an enlarged annular waist and positioned within the hollow shell.

5. The electrical precison test connector of claim 4 wherein said hollow shell is further characterized by slots within said shell and said annular dielectric insert is further characterized by nubs complementary to said slots and secured therein to prevent relative rotational movement of said electrical conductor therein.

6. The electrical precision test connector of claim 5 wherein the electrical conductor is secured within the hollow shell to prevent relative rotational movement of said electrical conductor therein and thereby to permit extraction of the rear contact surface of said electrical precision test connector assembly from the port of said fixed plate, rotation of said assembly, including the conductor, spring means and shell, 90 degrees relative to said port, and reloading of the rear contact surface of the test connector within said port of the fixed plate.

7. The electrical precision test connector assembly of claim 1 wherein the hollow shell comprises a hollow jack body with said rear contact surface and an outer body with partial overlap portion with outward flange circumferential to the outer body and further comprising cup-shaped mounting member with inward lip encompassing the outer body to define an annular groove between outer body and mounting member.

8. The electrical precision test connector of claim 7 further comprising the spring means positioned within the annular groove with one end biased against the outward flange of the outer body and one end biased against the inward lip of the mounting member to urge the contact surface of the jack body into complete electrical contact with a corresponding body of a component which is to be tested.

9. The electrical precision test connector assembly of claim 8 wherein the electrical conductor is recessed at the end portion opposite the slotted end portion, for connection with a corresponding electrical conductor.

* * * * *